United States Patent
Dinkel

(10) Patent No.: US 9,922,904 B2
(45) Date of Patent: Mar. 20, 2018

(54) SEMICONDUCTOR DEVICE INCLUDING LEAD FRAMES WITH DOWNSET

(71) Applicant: Infineon Technologies AG, Neubiberg (DE)

(72) Inventor: Markus Dinkel, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/721,359

(22) Filed: May 26, 2015

(65) Prior Publication Data

US 2016/0351475 A1    Dec. 1, 2016

(51) Int. Cl.

| H01L 23/495 | (2006.01) |
|---|---|
| H01L 21/78 | (2006.01) |
| H01L 23/00 | (2006.01) |
| H01L 23/31 | (2006.01) |
| H01L 21/56 | (2006.01) |

(52) U.S. Cl.
CPC ........ H01L 23/49503 (2013.01); H01L 21/78 (2013.01); H01L 23/49537 (2013.01); H01L 23/49551 (2013.01); H01L 24/97 (2013.01); H01L 21/561 (2013.01); H01L 23/3107 (2013.01); H01L 2224/32245 (2013.01); H01L 2224/48091 (2013.01); H01L 2224/48247 (2013.01); H01L 2224/73265 (2013.01); H01L 2224/92247 (2013.01); H01L 2224/97 (2013.01); H01L 2924/181 (2013.01)

(58) Field of Classification Search
CPC ........... H01L 23/3107; H01L 23/49537; H01L 23/49503; H01L 21/561; H01L 23/495; H01L 21/56; H01L 23/59541; H01L 24/45; H01L 23/49551; H01L 21/4842; H01L 23/49838
See application file for complete search history.

(56) References Cited

U.S. PATENT DOCUMENTS

| 6,476,474 | B1 | 11/2002 | Hung |
|---|---|---|---|
| 7,245,007 | B1 * | 7/2007 | Foster ............... H01L 23/49527 257/666 |
| 7,259,460 | B1 * | 8/2007 | Bayan .................. H01L 21/568 257/728 |
| 7,952,175 | B2 * | 5/2011 | Cho .................. H01L 23/49537 257/666 |
| 8,093,707 | B2 | 1/2012 | Lee et al. |
| 2006/0049493 | A1 * | 3/2006 | Lee ..................... H01L 23/4951 257/666 |
| 2007/0001274 | A1 * | 1/2007 | Hinkle ............. H01L 23/49503 257/666 |
| 2007/0057353 | A1 * | 3/2007 | Hinkle ............. H01L 23/49503 257/676 |

(Continued)

OTHER PUBLICATIONS

"Multilayer Lead Frame", Jan. 16, 2012, Shinko Electric Industries Co., Ltd.; Publisher: http://www.shinko.co.jp/english/product/leadframe/multilayer.html.

Primary Examiner — Alonzo Chambliss
(74) Attorney, Agent, or Firm — Dicke, Billig & Czaja, PLLC

(57) ABSTRACT

A semiconductor device includes a planar first lead frame including a die pad, a semiconductor chip coupled to the die pad, and a second lead frame coupled to the first lead frame. The second lead frame includes leads arranged such that the die pad is downset with respect to the leads.

20 Claims, 10 Drawing Sheets

(56) References Cited

U.S. PATENT DOCUMENTS

| | | | |
|---|---|---|---|
| 2007/0057354 A1* | 3/2007 | Hinkle | H01L 23/49503 257/676 |
| 2007/0132073 A1* | 6/2007 | Tiong | H01L 21/561 257/666 |
| 2007/0215996 A1* | 9/2007 | Otremba | H01L 23/4334 257/678 |
| 2009/0014854 A1* | 1/2009 | Cho | H01L 23/49537 257/676 |
| 2013/0302946 A1* | 11/2013 | Lu | H01L 23/49537 438/113 |
| 2014/0191381 A1* | 7/2014 | Lee | H01L 23/49537 257/676 |
| 2015/0294924 A1* | 10/2015 | Bai | H01L 23/49503 257/676 |

* cited by examiner

SEMICONDUCTOR DEVICE INCLUDING LEAD FRAMES WITH DOWNSET

BACKGROUND

Semiconductor devices may include a semiconductor chip coupled to a lead frame. Multiple semiconductor devices may be fabricated on a lead frame strip, which includes a plurality of interconnected lead frames. At some point during the fabrication of the semiconductor devices, the connections between the lead frames are severed to provide a plurality of separated semiconductor devices each having a lead frame. A lead frame may include a die pad and leads where the die pad is downset with respect to the leads. For semiconductor devices including such lead frames, the fabrication of multiple semiconductor devices on a lead frame strip typically includes coupling one semiconductor chip at a time to a die pad of the lead frame strip.

For these and other reasons, there is a need for the present invention.

SUMMARY

One example of a semiconductor device includes a planar first lead frame including a die pad, a semiconductor chip coupled to the die pad, and a second lead frame coupled to the first lead frame. The second lead frame includes leads arranged such that the die pad is downset with respect to the leads.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Figure 1A:
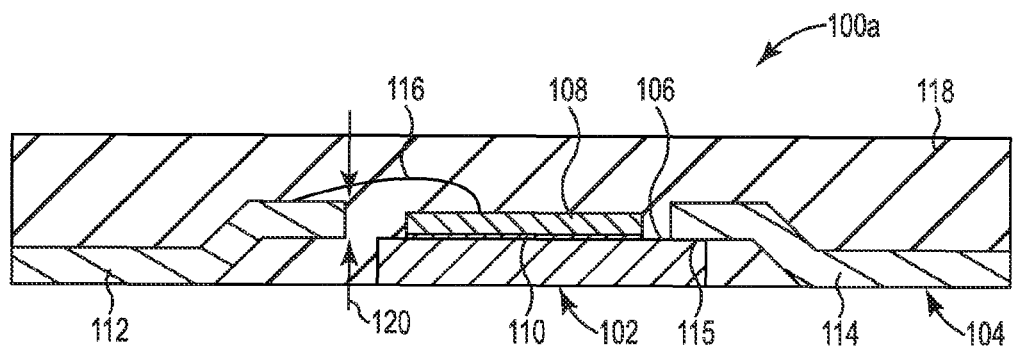
FIG. 1A illustrates a cross-sectional view of one example of a semiconductor device.

FIG. 1A illustrates a cross-sectional view of one example of a semiconductor device 100a. Semiconductor device 100a includes a first lead frame 102, a second lead frame 104, and a semiconductor chip 108. First lead frame 102 and second lead frame 104 are made of copper or another suitable metal. First lead frame 102 is a planar (i.e., flat) lead frame and includes a die pad 106. Second lead frame 104 includes a first lead 112 and a second lead 114. Die pad 106 of first lead frame 102 is downset with respect to first lead 112 and second lead 114 of second lead frame 104 as indicated at 120. Second lead frame 104 is coupled to first lead frame 102. In this example, lead 114 of second lead frame 104 is coupled to first lead frame 102 at 115. Second lead frame 104 may be coupled to first lead frame 102 by a weld (e.g., laser weld, resistance weld), a crimp, or another suitable connection such that second lead frame 104 is directly coupled to first lead frame 102.

The lower surface of semiconductor chip 108 is coupled to die pad 106 of first lead frame 102 via a joint 110. Joint 110 may be a diffusion solder joint, a sintered joint, a soft solder joint, an adhesive material, or other suitable material for coupling semiconductor chip 108 to die pad 106. In one example, joint 110 electrically couples semiconductor chip 108 to die pad 106. In another example, joint 110 thermally couples semiconductor chip 108 to die pad 106, and die pad 106 provides a heat sink for semiconductor chip 108.

A contact on the upper surface of semiconductor chip 108 is electrically coupled to lead 112 of second lead frame 104 via a bond wire 116. In other examples, one or more contacts on the upper surface of semiconductor chip 108 may be electrically coupled to corresponding leads of second lead frame 104 via bond wires, ribbons, clips, or other suitable interconnects. Encapsulation material 118 (e.g., mold material) encapsulates semiconductor chip 108, bond wire 116 and portions of first lead frame 102 and second lead frame 104 such that other portions of first lead frame 102 and second lead frame 104 remain exposed to provide electrical contacts to semiconductor chip 108.

Figure 1B:
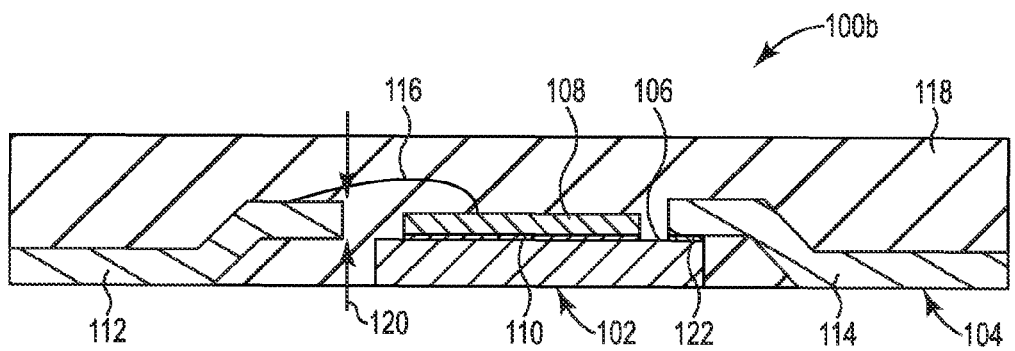
FIG. 1B illustrates a cross-sectional view of another example of a semiconductor device.

FIG. 1B illustrates a cross-sectional view of another example of a semiconductor device 100b. Semiconductor device 100b is similar to semiconductor device 100a previously described and illustrated with reference to FIG. 1A, except that semiconductor device 100b includes a joint 122 coupling lead 114 of second lead frame 104 to first lead frame 102. Joint 122 may be a diffusion solder joint, a sintered joint, a soft solder joint, an adhesive material, or another suitable material for coupling second lead frame 104 to first lead frame 102.

Figure 1C:
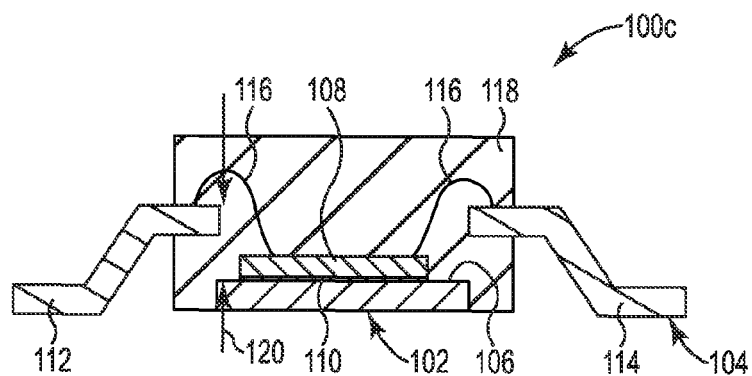
FIG. 1C illustrates a cross-sectional view of another example of a semiconductor device.

FIG. 1C illustrates a cross-sectional view of another example of a semiconductor device 100c. Semiconductor device 100c is similar to semiconductor devices 100a and 100b previously described and illustrated with reference to FIGS. 1A and 1B, respectively, except that in semiconductor device 100c, lead 114 of second lead frame 104 is electrically coupled to semiconductor chip 108 via a bond wire 116. In addition, the downset indicated at 120 is greater for semiconductor device 100c than for semiconductor devices 100a and 100b. Encapsulation material 118 of semiconductor device 100c also leaves more of each lead 112 and 114 exposed compared to semiconductor devices 100a and 100b.

Figure 2A:
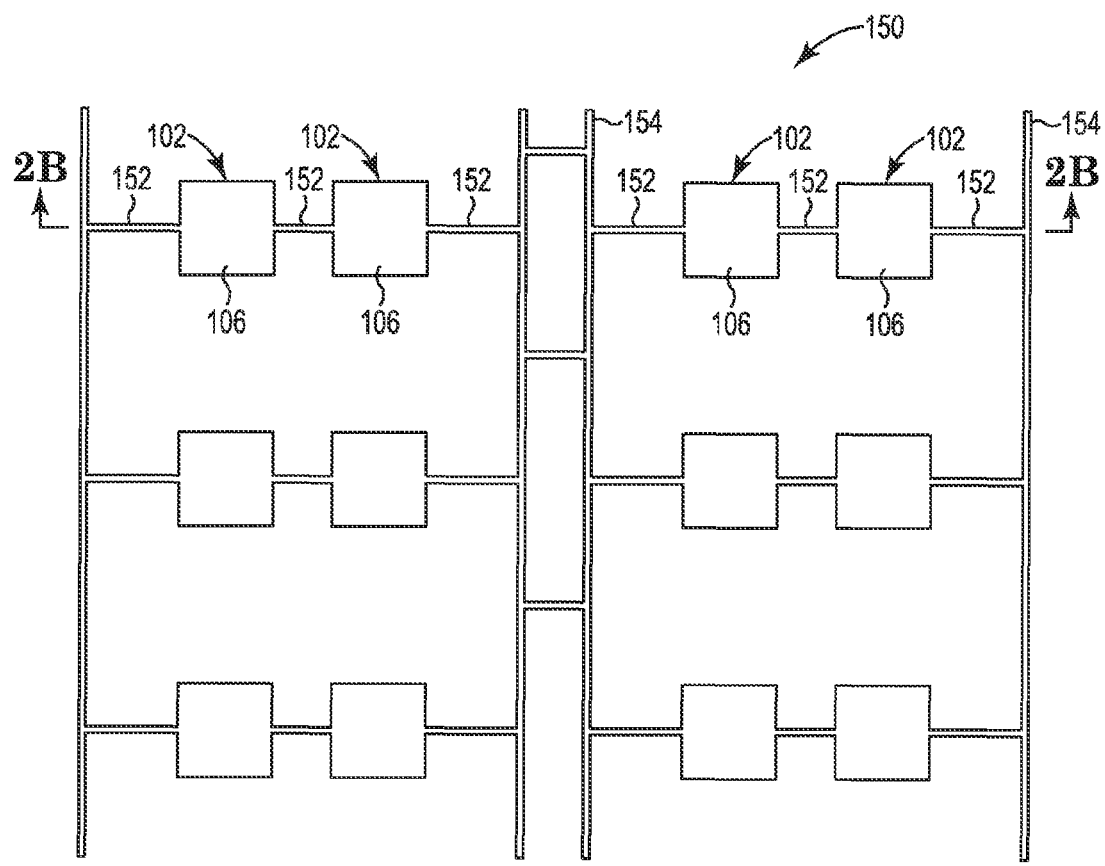
FIGS. 2A and 2B illustrate one example of a first lead frame strip.
Figure 2B:
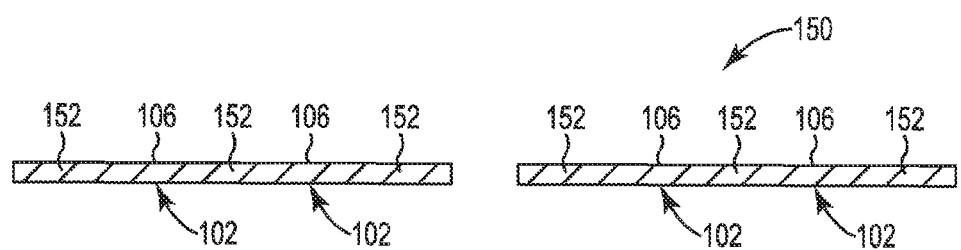

FIG. 2A illustrates a top view of one example of a first lead frame strip 150. FIG. 2B illustrates a cross-sectional view of first lead frame strip 150 as indicated in FIG. 2A. First lead frame strip 150 is planar and includes a plurality of first lead frames 102. Each first lead frame 102 includes a die pad 106 and is connected to an adjacent lead frame and/or to a support structure 154 via tie bars 152. First lead frame strip 150 may include any suitable number of rows and columns of first lead frames 102 interconnected via tie bars 152 and support structure 154. In one example, as illustrated in FIGS. 2A and 2B, each first lead frame 102 is consisting of a planar die pad 106 and planar tie bars 152 aligned with the planar die pad 106.

Figure 3A:
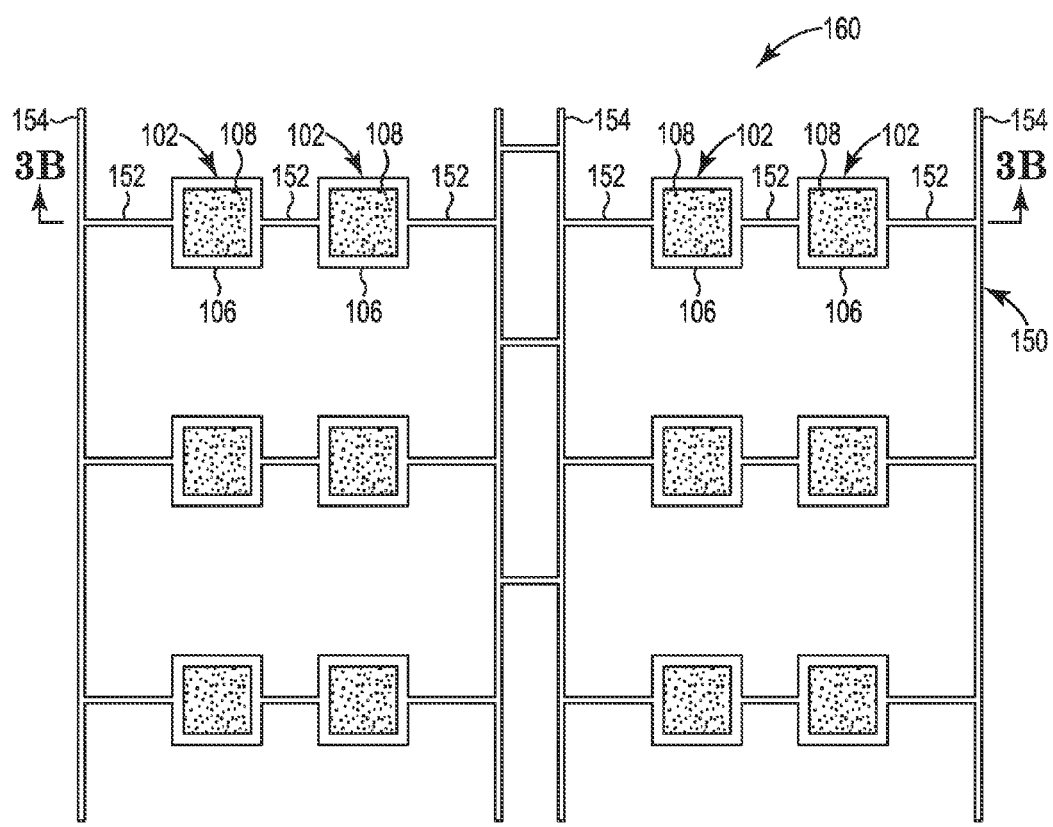
FIGS. 3A and 3B illustrate one example of a semiconductor device assembly including the first lead frame strip and semiconductor chips.
Figure 3B:
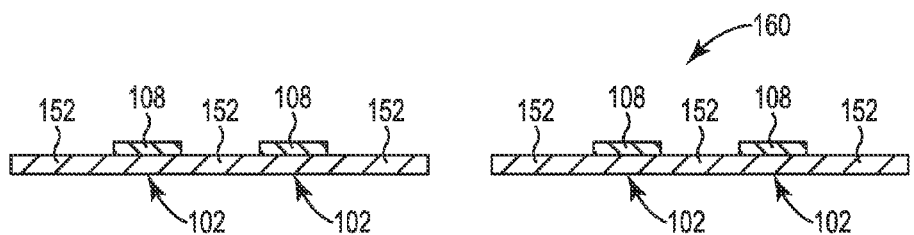

FIG. 3A illustrates a top view of one example of a semiconductor device assembly 160 including first lead frame strip 150 and semiconductor chips 108. FIG. 3B illustrates a cross-sectional view of semiconductor device assembly 160 as indicated in FIG. 3A. In one example, semiconductor chips 108 are coupled to die pads 106 of first lead frames 102 of first lead frame strip 150 in a batch process. Semiconductor chips 108 may be coupled to die pads 106 by diffusion soldering, sintering, soft soldering, adhering, or other suitable attachment process. Since first lead frame strip 150 is planar, a process for attaching semiconductor chips 108 to die pads 106 may be simplified compared to a process for attaching semiconductor chips to lead frames that are not planar (e.g., lead frames that includes a downset). For example, since first lead frame strip 150 is planar, the heat and pressure applied to the semiconductor chips 108 during a diffusion soldering process or sintering process may be applied to all the semiconductor chips simultaneously.

Figure 4:
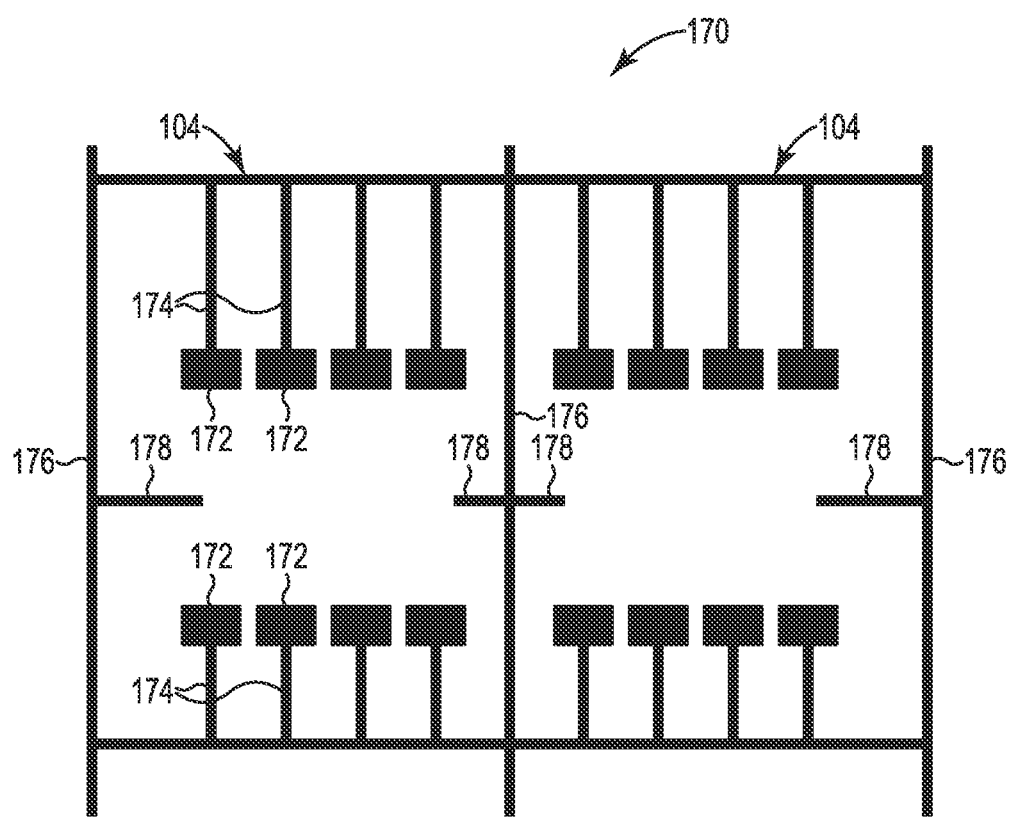
FIG. 4 illustrates one example of a second lead frame strip.

FIG. 4 illustrates one example of a second lead frame strip 170. Second lead frame strip 170 includes a plurality of second lead frames 104 connected to each other via a support structure 176. Second lead frame strip 170 may include any suitable number of rows and columns of second lead frames 104 interconnected via support structure 176. In one example, the number of rows and columns of second lead frames 104 of second lead frame strip 170 corresponds to the number of rows and columns of first lead frames 102 of first lead frame strip 150. Each second lead frame 104 includes a plurality of leadposts 172 connected to respective leads 174. Each second lead frame 104 also includes tie bar portions 178 for coupling to respective first lead frames 102.

Figure 5A:
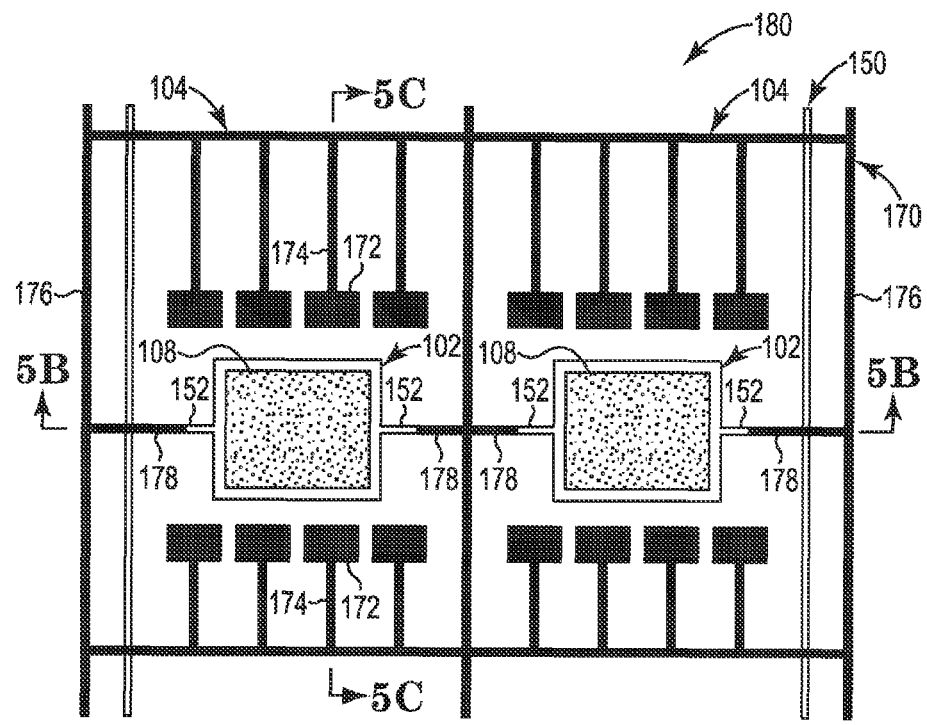
FIGS. 5A-5C illustrate one example of a semiconductor device assembly including the second lead frame strip coupled to the first lead frame strip.
Figure 5B:
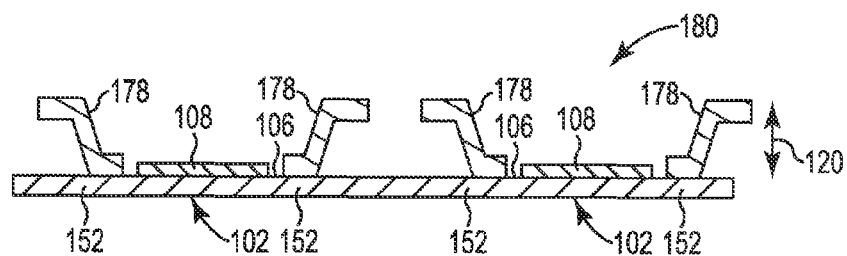
Figure 5C:
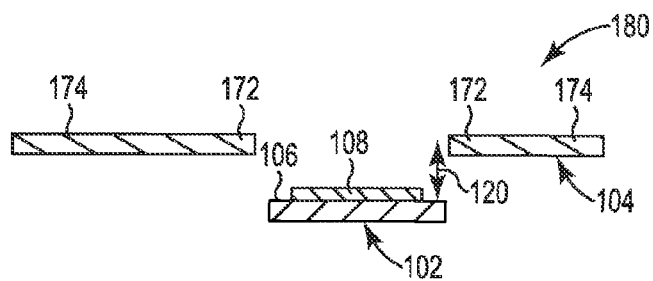

FIG. 5A illustrates one example of a semiconductor device assembly 180 including second lead frame strip 170 coupled to first lead frame strip 150. FIGS. 5B and 5C illustrate cross-sectional views of semiconductor device assembly 180 as indicated in FIG. 5A. As illustrated in FIG. 5B, second lead frame strip 170 is coupled to first lead frame strip 150 by coupling tie bars 152 of first lead frame strip 150 to respective tie bar portions 178 of second lead frame strip 170. In other examples, second lead frame strip 170 may be coupled to first lead frame strip 150 at other points between second lead frame strip 170 and first lead frame strip 150. Second lead frame strip 170 is coupled to first lead frame strip 150 by welding (e.g., laser welding, resistance welding), crimping, diffusion soldering, sintering, soft soldering, adhering, or other suitable attachment process. As illustrated in FIGS. 5B and 5C, with second lead frame strip 170 coupled to first lead frame strip 150, die pads 106 are downset with respect to leads 174 and tie bar portions 178 as indicated at 120.

Figure 6:
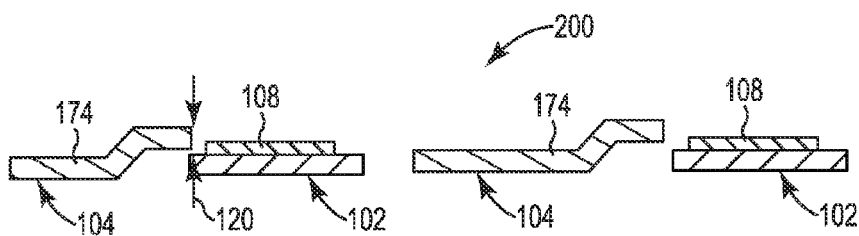
FIG. 6 illustrates a cross-sectional view of another example of a semiconductor device assembly including of a first lead frame strip coupled to a second lead frame strip.

FIG. 6 illustrates a cross-sectional view of another example of a semiconductor device assembly 200 including a first lead frame strip coupled to a second lead frame strip. In this example, each second lead frame 104 of the second lead frame strip includes leads 174 on one side of each respective first lead frame 102. Each lead 174 is shaped such that a downset indicated at 120 substantially equals the thickness of the leads.

Figure 7:
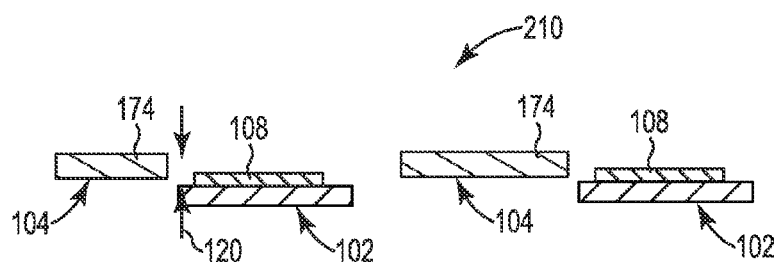
FIG. 7 illustrates a cross-sectional view of another example of a semiconductor device assembly including a first lead frame strip coupled to a second lead frame strip.

FIG. 7 illustrates a cross-sectional view of another example of a semiconductor device assembly 210 including a first lead frame strip coupled to a second lead frame strip. In this example, each second lead frame 104 of the second lead frame strip includes leads 174 on one side of each respective first lead frame 102. In this example, each lead 174 is planer and the downset indicated at 120 substantially equals the thickness of the leads.

Figure 8:
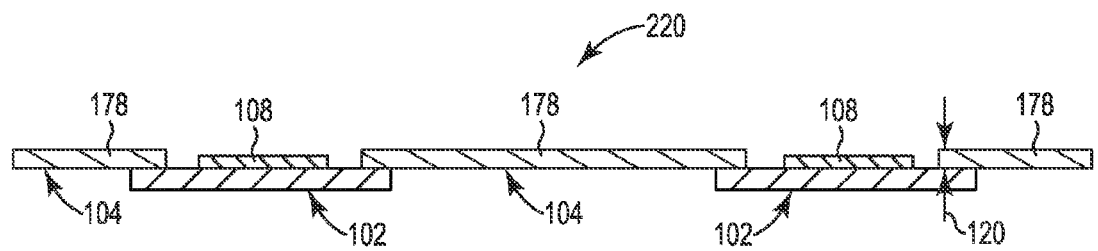
FIG. 8 illustrates a cross-sectional view of another example of a semiconductor device assembly including a first lead frame strip coupled to a second lead frame strip.

FIG. 8 illustrates a cross-sectional view of another example of a semiconductor device assembly 220 including a first lead frame strip coupled to a second lead frame strip. In this example, the second lead frame strip and each second lead frame 104 is planer and the downset indicated at 120 substantially equals the thickness of the second lead frame strip. The second lead frame strip is coupled to the first lead frame strip via tie bar portions 178 of the second lead frames 104.

Figure 9:
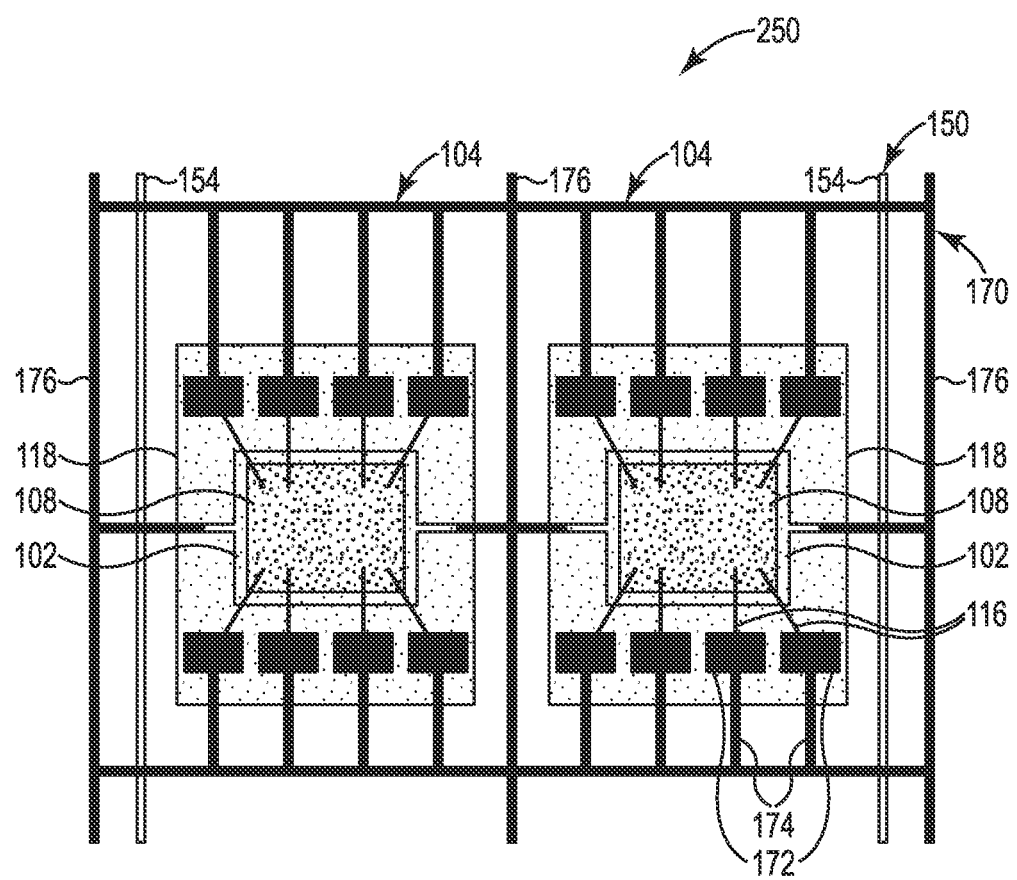
FIG. 9 illustrates one example of a semiconductor device assembly including a first lead frame strip coupled to a second lead frame strip after wire bonding and encapsulation.

FIG. 9 illustrates one example of a semiconductor device assembly 250 including first lead frame strip 150 and second lead frame strip 170 after wire bonding and encapsulation. In this example, contacts on the upper surface of each semiconductor chip 108 are electrically coupled to respective leadposts 172 via bond wires 116. In other examples, contacts on the upper surface of each semiconductor chip 108 may be coupled to leads 172 and/or leadposts 174 via ribbons, clips, or other suitable interconnects. Semiconductor chips 108, bond wires 116, leadposts 172, and portions of leads 174 are then encapsulated with encapsulation material 118. The semiconductor devices may then be singulated by removing each semiconductor device from support structure 154 of first lead frame strip 150 and support structure 176 of second lead frame strip 170.

Figure 10:
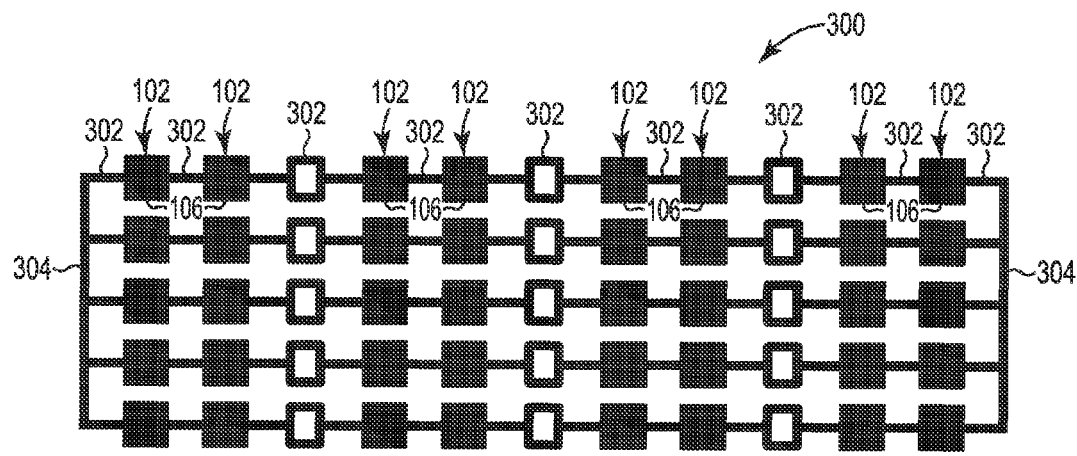
FIG. 10 illustrates one example of a high density first lead frame strip.

FIG. 10 illustrates one example of a high density first lead frame strip 300. High density first lead frame strip 300 is planar and includes a plurality of first lead frames 102. Each first lead frame 102 includes a die pad 106 and is connected to an adjacent lead frame and/or to a support structure 304 via tie bars 302. High density first lead frame strip 300 may include any suitable number of rows and columns of first lead frames 102 interconnected via tie bars 302 and support structure 304. In comparison to first lead frame strip 150 previously described and illustrated with reference to FIGS. 2A and 2B, high density first lead frame strip 300 includes less space between adjacent rows of first lead frames 102. Thus, high density first lead frame strip 300 enables a greater density of semiconductor chips to be attached in a batch process compared to first lead frame strip 150.

Figure 11:
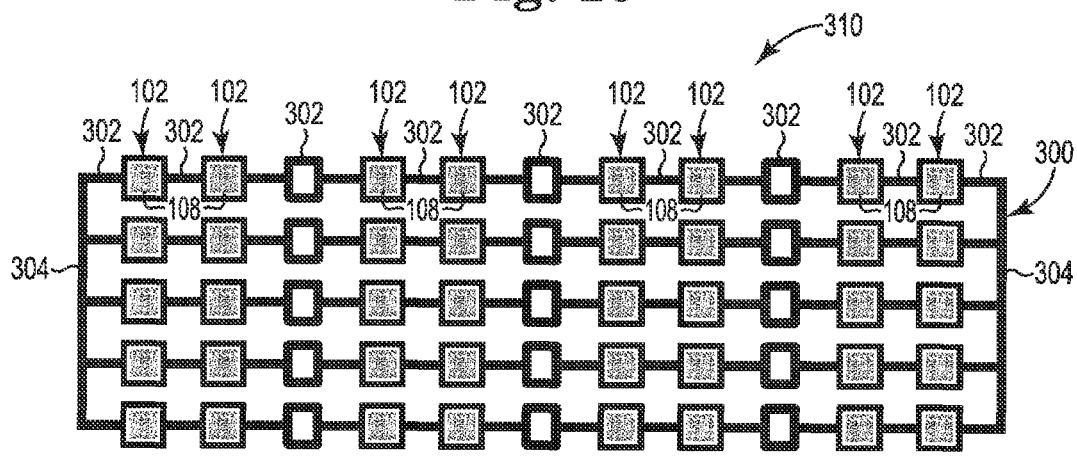
FIG. 11 illustrates one example of a semiconductor device assembly including the high density first lead frame strip and semiconductor chips.

FIG. 11 illustrates one example of a semiconductor device assembly 310 including semiconductor chips 108 coupled to high density first lead frame strip 300. In one example, semiconductor chips 108 are coupled to die pads 106 of first lead frames 102 of high density first lead frame strip 300 in a batch process. Semiconductor chips 108 may be coupled to die pads 106 by diffusion soldering, sintering, soft soldering, adhering, or other suitable attachment process. Since high density first lead frame strip 300 is planar, a process for attaching semiconductor chips 108 to die pads 106 may be simplified compared to a process for attaching semiconductor chips to lead frames that are not planar (e.g., lead frames that includes a downset). For example, since high density first lead frame strip 300 is planar, the heat and pressure applied to the semiconductor chips 108 during a diffusion soldering process or sintering process may be applied to all the semiconductor chips simultaneously.

Figure 12:
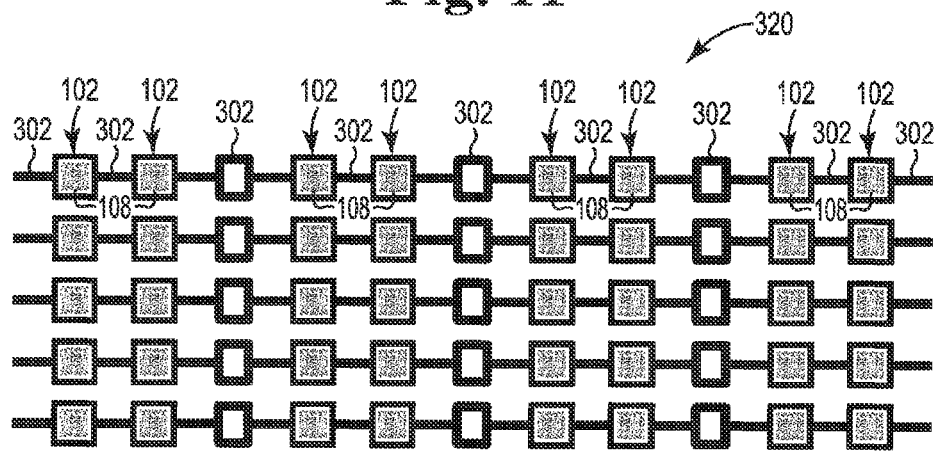
FIG. 12 illustrates one example of a plurality of lead frame rows after singulation of the high density first lead frame strip.

FIG. 12 illustrates one example of a plurality of lead frame rows 320 after singulation of high density first lead frame strip 300. High density first lead frame strip 300 is separated into a plurality of lead frame rows 320 by removing each row of lead frames from support structure 304 of high density first lead frame strip 300. In one example, each separate lead frame row 320 is also referred to as a single row lead frame strip. In one example, as illustrated in FIG. 12, each lead frame row or strip 320 consists of a plurality of planar die pads and planer tie bars.

Figure 13:
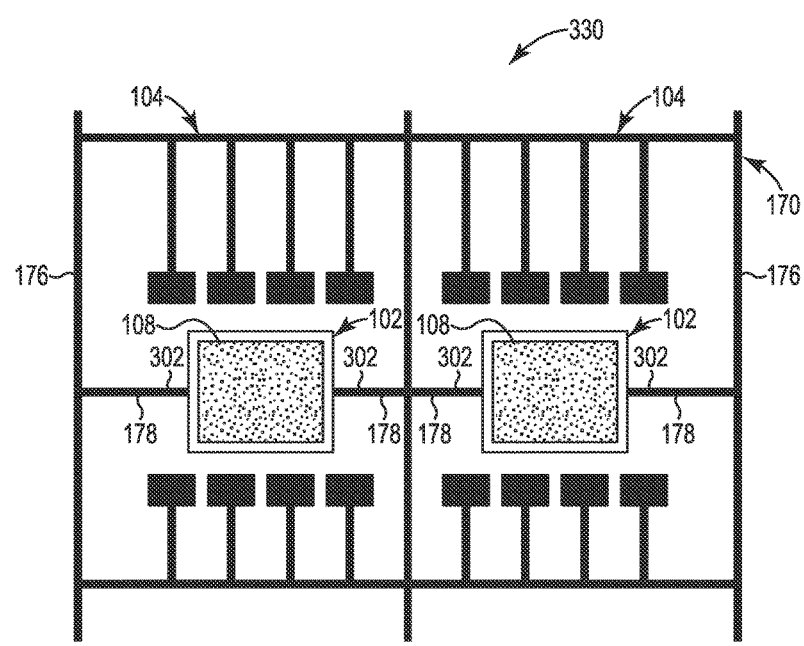
FIG. 13 illustrates one example of a semiconductor device assembly including a second lead frame strip coupled to a lead frame row.

FIG. 13 illustrates one example of a semiconductor device assembly 330 including a second lead frame strip 170 coupled to a lead frame row 320. While FIG. 13 illustrates one lead frame row for simplicity, in other examples, a corresponding number of lead frame rows may be coupled to a single second lead frame strip. Second lead frame strip 170 is coupled to lead frame row 320 by coupling tie bars 302 of lead frame row 320 to respective tie bar portions 178 of second lead frame strip 170. Second lead frame strip 170 is coupled to lead frame row 320 by welding (e.g., laser welding, resistance welding), crimping, diffusion soldering, sintering, soft soldering, adhering, or other suitable attachment process.

Figure 14:
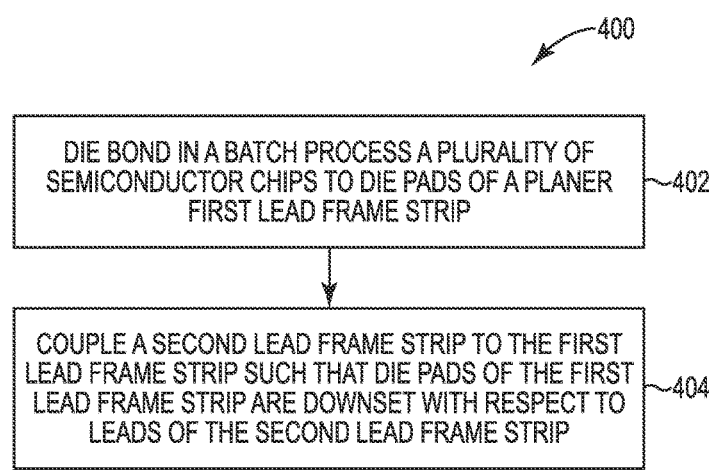
FIG. 14 is a flow diagram illustrating one example of a method for fabricating a semiconductor device.

FIG. 14 is a flow diagram illustrating one example of a method 400 for fabricating a semiconductor device. At 402, in a batch process, a plurality of semiconductor chips are die bonded to die pads of a planer first lead frame strip. The die bonding may include diffusion soldering the plurality of semiconductor chips to the die pads of the first lead frame strip. At 404, a second lead frame strip is coupled to the first lead frame strip such that die pads of the first lead frame strip are downset with respect to leads of the second lead frame strip. In one example, coupling the second lead frame strip to the first lead frame strip includes welding the second lead frame strip to the first lead frame strip. In another example, coupling the second lead frame strip to the first lead frame strip includes soldering (e.g., diffusion soldering or soft soldering) the second lead frame strip to the first lead frame strip. In yet another example, coupling the second lead frame strip to the first lead frame strip includes crimping the second lead frame strip to the first lead frame strip. The first lead frame strip may include die pads arranged in rows and columns. The method may further include separating the first lead frame strip into a plurality of rows after the die bonding and coupling the second lead frame strip to each of the plurality of rows of the separated first lead frame strip.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
 a first lead frame consisting of a planar die pad and entirely planar tie bars aligned with the planar die pad;
 a semiconductor chip coupled to the die pad; and
 a second lead frame electrically coupled to the first lead frame, the second lead frame comprising leads arranged such that the die pad is downset with respect to the leads.

2. The semiconductor device of claim 1, further comprising:
 a diffusion solder joint coupling the semiconductor chip to the die pad.

3. The semiconductor device of claim 1, further comprising:
 a sintered joint coupling the semiconductor chip to the die pad.

4. The semiconductor device of claim 1, wherein the second lead frame is directly coupled to the first lead frame.

5. The semiconductor device of claim 1, wherein the second lead frame is welded to the first lead frame.

6. The semiconductor device of claim 1, wherein the second lead frame is crimped to the first lead frame.

7. The semiconductor device of claim 1, wherein the second lead frame is soldered to the first lead frame.

8. The semiconductor device of claim 1, further comprising:
 at least one interconnect electrically coupling the semiconductor chip to a lead of the second lead frame.

9. The semiconductor device of claim 1, further comprising:
 an encapsulation material encapsulating the semiconductor chip and at least portions of the first lead frame and the second lead frame.

10. A semiconductor device assembly comprising:
 a first lead frame strip consisting of a plurality of planar die pads and entirely planar tie bars aligned with the planar die pads;
 a plurality of first semiconductor chips, each first semiconductor chip coupled to a die pad of the first lead frame strip; and
 a second lead frame strip electrically coupled to the first lead frame strip such that each die pad of the first lead frame strip is downset with respect to leads of the second lead frame strip.

11. The semiconductor device assembly of claim 10, wherein the first lead frame strip is a single row lead frame strip, the semiconductor device assembly further comprising:
 a planar single row third lead frame strip comprising a plurality of die pads; and
 a plurality of second semiconductor chips, each second semiconductor chip coupled to a die pad of the third lead frame strip,
 wherein the second lead frame strip is electrically coupled to the third lead frame strip such that each die pad of the third lead frame strip is downset with respect to leads of the second lead frame strip.

12. The semiconductor device assembly of claim 10, wherein the second lead frame strip is welded, soldered, or crimped to the first lead frame strip.

13. The semiconductor device assembly of claim 10, further comprising:
   a diffusion solder joint coupling each first semiconductor chip to a die pad of the first lead frame strip.

14. The semiconductor device assembly of claim 10, wherein each die pad of the first lead frame strip is downset with respect to leads of the second lead frame strip by a distance substantially equal to a thickness of the second lead frame strip.

15. A method for fabricating a semiconductor device, the method comprising:
   die bonding in a batch process a plurality of semiconductor chips to planar die pads of a first lead frame strip, the first lead frame strip consisting of the planar die pads and entirely planar tie bars aligned with the planar die pads; and
   coupling a second lead frame strip to the first lead frame strip such that die pads of the first lead frame strip are downset with respect to leads of the second lead frame strip.

16. The method of claim 15, wherein coupling the second lead frame strip to the first lead frame strip comprises welding the second lead frame strip to the first lead frame strip.

17. The method of claim 15, wherein coupling the second lead frame strip to the first lead frame strip comprises soldering the second lead frame strip to the first lead frame strip.

18. The method of claim 15, wherein coupling the second lead frame strip to the first lead frame strip comprises crimping the second lead frame strip to the first lead frame strip.

19. The method of claim 15, wherein the die bonding comprises diffusion soldering the plurality of semiconductor chips to the die pads of the first lead frame strip.

20. The method of claim 15, wherein the first lead frame strip comprises die pads arranged in rows and columns, the method further comprising:
   separating the first lead frame strip into a plurality of rows after the die bonding,
   wherein coupling the second lead frame strip to the first lead frame strip comprises coupling the second lead frame strip to each of the plurality of rows of the separated first lead frame strip.

* * * * *